(12) United States Patent
Zhang

(10) Patent No.: US 8,826,109 B2
(45) Date of Patent: Sep. 2, 2014

(54) LDPC DECODER IRREGULAR DECODING OF REGULAR CODES

(75) Inventor: Fan Zhang, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 175 days.

(21) Appl. No.: 13/602,535

(22) Filed: Sep. 4, 2012

(65) Prior Publication Data

US 2014/0068381 A1    Mar. 6, 2014

(51) Int. Cl.
*H03M 13/00*    (2006.01)

(52) U.S. Cl.
USPC ........... 714/780; 714/757; 714/752; 714/774; 714/786

(58) Field of Classification Search
None
See application file for complete search history.

(56) References Cited

U.S. PATENT DOCUMENTS

| | | | |
|---|---|---|---|
| 7,113,356 B1 | 9/2006 | Wu | |
| 7,237,181 B2* | 6/2007 | Richardson | 714/780 |
| 8,675,693 B2* | 3/2014 | Palanki et al. | 370/546 |
| 2006/0256670 A1 | 11/2006 | Park | |
| 2008/0301521 A1* | 12/2008 | Gunnam et al. | 714/757 |
| 2011/0164669 A1 | 7/2011 | Mathew | |
| 2012/0131415 A1* | 5/2012 | Park et al. | 714/758 |

OTHER PUBLICATIONS

U.S. Appl. No. 13/400,750, filed Feb. 21, 2012, Fan Zhang, Unpublished.
U.S. Appl. No. 138433,742, filed Mar. 29, 2012, Fan Zhang, Unpublished.
U.S. Appl. No. 13/316,953, filed Dec. 12, 2011, Haitao Xia, Unpublished.
U.S. Appl. No. 13/561,230, filed Jul. 30, 2012, Fan Zhang, Unpublished.
U.S. Appl. No. 13/340,974, filed Dec. 30, 2011, Dan Liu, Unpublished.
U.S. Appl. No. 13/558,245, filed Jul. 25, 2012, Fan Zhang, Unpublished.
U.S. Appl. No. 13/552,403, filed Jul. 18, 2012, Fan Zhang, Unpublished.
U.S. Appl. No. 13/560,702, filed Jul. 27, 2012, Fan Zhang, Unpublished.
U.S. Appl. No. 13/342,240, filed Jan. 3, 2012, Shaohua Yang, Unpublished.
U.S. Appl. No. 13/445,848, filed Apr. 12, 2012, Bruce Wilson, Unpublished.
U.S. Appl. No. 13/251,342, filed Oct. 3, 2011, Haitao Xia, Unpublished.

* cited by examiner

*Primary Examiner* — John Trimmings
(74) *Attorney, Agent, or Firm* — Hamilton DeSanctis & Cha

(57) ABSTRACT

The present inventions are related to systems and methods for irregular decoding of regular codes in an LDPC decoder, and in particular to allocating decoding resources based in part on data quality.

20 Claims, 7 Drawing Sheets

LDPC DECODER IRREGULAR DECODING OF REGULAR CODES

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in Low Density Parity Check (LDPC) decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,4) & 0 & a(1,6) & a(1,7) & 0 \\ 0 & a(2,2) & a(2,3) & 0 & a(2,5) & 0 & 0 & a(2,8) \\ a(3,1) & 0 & a(3,3) & 0 & a(3,5) & a(3,6) & 0 & 0 \\ 0 & a(4,2) & 0 & a(4,4) & 0 & 0 & a(4,7) & a(4,8) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-124 and check nodes 102-108, with the values in the nodes 102-124 being adjusted based on the messages that are passed, until the values converge and stop changing or until processing is halted.

Because of noise or errors in data to be decoded, some data bits or symbols have lower quality than others, that is, there is a lower probability that they have the correct value. As messages are passed between check nodes and variable nodes in the decoder, this low quality data can pollute the processing of higher quality data in the decoder, slowing data convergence.

BRIEF SUMMARY

The present inventions are related to systems and methods for irregular decoding of regular codes in an LDPC decoder, and in particular to allocating decoding resources based in part on data quality. Data is sorted by quality in the LDPC decoder, and in early decoding iterations, higher quality data are given more frequent message updates and lower quality data are given less frequent message updates. In some embodiments, data is sorted at the beginning of a decoding operation for the data according to their information divergence. Message updates are performed more frequently for higher quality data in some embodiments by freezing variable node updates and variable node to check node message preparation for lower quality data during early decoding iterations. In such embodiments, old variable node to check node messages may be reused while the lower quality data is frozen, with reused old variable node to check node messages being passed to check nodes along with newly generated variable node to check node messages for the higher quality data. In some embodiments, freezing of variable node updates and variable node to check node message preparation for lower quality data is maintained for a predetermined portion of the available decoding iterations for the data, such as for the first half of the decoding iterations, and normal decoding is performed on all data for the second half of the decoding iterations.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for irregular decoding of regular codes in an LDPC decoder, and in particular to allocating decoding resources based in part on data quality. The LDPC decoder used in various embodiments may be any type of LDPC decoder, including binary and non-binary, layered and non-layered. Although the LDPC decoder with irregular decoding of regular codes may be binary, using bits, or non-binary, using symbols, the example embodiments use the symbols of a non-binary LDPC decoder. However, these and other embodiments may be adapted to use with binary LDPC decoders. LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 1:
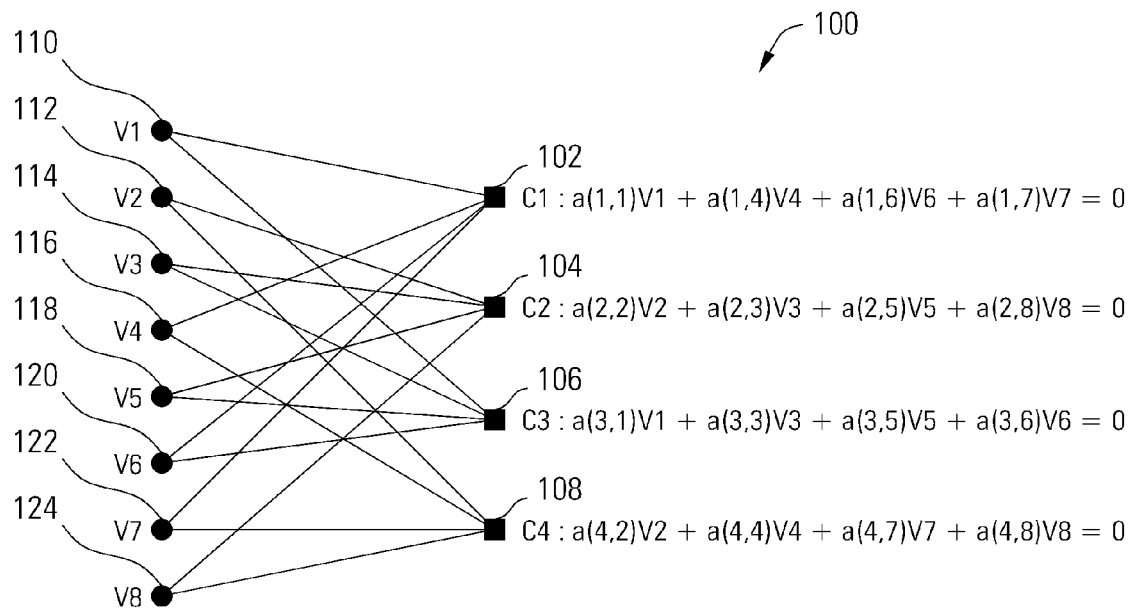
FIG. 1 depicts a Tanner graph of an example prior art LDPC code.

A regular LDPC code is one with a constant row weight and a constant column weight, that is, the same number of non-zero entries in each column of the H matrix, and the same number of non-zero entries in each row of the H matrix. For example, the H-matrix disclosed above and corresponding to the Tanner graph of FIG. 1 is a regular LDPC code with a column weight of 2 and a row weight of 4. An irregular LDPC code, contrast, can have non-uniform weights, that is, different column weights and different row weights. A regular LDPC code generally approaches the Shannon limit for information capacity in a data channel, although it may not achieve quite the performance of a turbo code. An irregular LDPC code balances the competing needs for variable nodes to have a large weight (many input connections) to quickly converge to the correct values versus check nodes with small weight (fewer input connections) to improve LDPC code performance. The non-uniform weights of an irregular LDPC code enables the variable nodes with larger weight to quickly converge to the correct values, which increases message quality to the check nodes, then helping lower weight variable nodes to converge. As a result, irregular LDPC codes can have better waterfall performance than regular LDPC codes. However, the non-uniform weights of an irregular LDPC code generally require more complex decoder hardware.

The LDPC decoder with irregular decoding of regular codes disclosed herein maintains the simpler hardware associated with a regular LDPC code, while achieving some of the benefits of an irregular LDPC code. While the LDPC decoder still operates on regular LDPC codes, it initially allocates more decoding resources to higher quality variable node values, enabling those variable nodes to converge more quickly. During later decoding stages, the decoding resources are allocated in a more typical fashion, so that the converged or partially converged higher quality variable node values can assist the lower quality values to converge. This introduces irregularity to the decoding of a regular LDPC code. This initial focus of processing resources on higher quality variable node values in a regular LDPC code is referred to herein as irregular decoding of regular codes.

The sorting or division of variable node values is performed in some embodiments based at least in part on the a priori knowledge of the quality, or noise level, of the LLR values or other format data used as input to the LDPC decoder. Different symbols in a particular data sector to be decoded will have different LLR qualities. For example, the LDPC decoder input values may be generated by a Soft Output Viterbi Algorithm (SOVA) data detector, which yields LLR values representing the likelihood that symbols have particular values. The quality of the symbols may be derived from the LLR values using an algorithm such as an Information Divergence algorithm as disclosed in U.S. patent application Ser. No. 13/558,245, filed Jan. Jul. 25, 2012 for "Systems and Methods for Information Divergence Based Data Processing", which is incorporated herein for all purposes. In other embodiments, the quality of the symbol LLR values may be determined using other algorithms. In some embodiments, the input data to the LDPC decoder may have another format than LLR values, with the quality of the data at the LDPC decoder input determined in any suitable manner. In yet other embodiments, the quality of the data may be determined inside the LDPC decoder after preliminary processing, such as after an initial local decoding iteration within the LDPC decoder, using a quality determination circuit either within or external to the LDPC decoder.

Given a limited decoding resource, such as the number of decoding iterations, the LDPC decoder with irregular decoding of regular codes allocates more resources, such as the number of decoding iterations in which the LLR values are updated or processed, to good quality symbols and less on poor quality symbols. This is accomplished in some embodiments by freezing the variable node to check node (V2C) messages for poor quality symbols during early stage decoding iterations, preventing the poor quality symbols from polluting V2C messages. In some embodiments, the number of V2C messages passed during a decoding iteration is unchanged, allowing the relatively simple regular code hardware to remain unchanged, by passing previously calculated V2C messages for poor quality symbols during the early stage decoding iterations. For example, during a first decoding iteration for a data sector, V2C messages are calculated for all symbols regardless of quality. During the subsequent early stage decoding iterations, those V2C messages calculated during the first decoding iteration for the poor quality symbols are reused and passed along with the updated V2C messages for the good quality symbols. The values for the good quality symbols are thus allowed to converge during the early stage decoding iterations while the poor quality symbols are frozen. During late stage decoding iterations, the poor quality symbols are unfrozen, and new V2C messages are calculated and passed for both poor and good quality symbols. The good quality symbols will likely have converged or will be close to convergence from the early stage decoding iterations, and will assist the poor quality symbols to converge during the late stage decoding iterations.

In some embodiments, the symbols are sorted into two groups, a good quality group and a poor quality group. The quality threshold dividing the groups may be fixed at a particular value, either based on exhaustive searches to identify the value that provides the desired decoding performance, or using heuristics to select the value, or arbitrarily, for example dividing the possible quality range in half or dividing the number of symbols into a certain proportion, with a particular fraction of the symbols selected for the good quality group and the remainder in the poor quality group. In other embodiments, symbols may be divided into more than two quality groups.

Similarly, the length of the freezing period for poor quality symbols may be fixed at a particular duration, either based on exhaustive searches to identify the value that provides the desired decoding performance, or using heuristics to select the value, or arbitrarily, for example dividing the maximum number of decoding iterations allowed for a data sector in half or at another fractional portion of the maximum. In other embodiments, the freezing period may be entirely or partially determined dynamically based on the convergence status of the good quality symbols for which V2C messages are not frozen. For example, the poor quality symbols may be frozen by default for the first half of the maximum number of decoding iterations, but may be unfrozen earlier than that point if the good quality symbols have converged and LLR values are no longer changing. In embodiments with more than two quality groups, multiple unfreezing points may be established, unfreezing the V2C message calculation for another of the quality groups at each unfreezing point. The freezing period may be based on the total number of iterations performed during the decoding of a data sector, considering both global iterations in the overall data processing system and local iterations internal to the LDPC decoder as a single group, or may be based only on local iterations, performing the freezing and unfreezing algorithm on the set of local iterations within each global iteration.

The threshold values, either the quality threshold or the freezing period iteration threshold or both, are determined in some embodiments during a calibration operation. A test data sector is repeatedly decoded while sweeping the threshold value or values and analyzing the decoding results to empirically identify the threshold value or values that provide the desired decoding performance. Such a calibration operation may be performed at design time or during a self-test operation at the beginning of operation or during inactive periods of operation.

The quality of the symbols may be calculated in any suitable manner. Again, in some embodiments, the quality of the symbols is calculated by applying an information divergence algorithm on the LLR values provided as input to the LDPC decoder.

Figure 2:
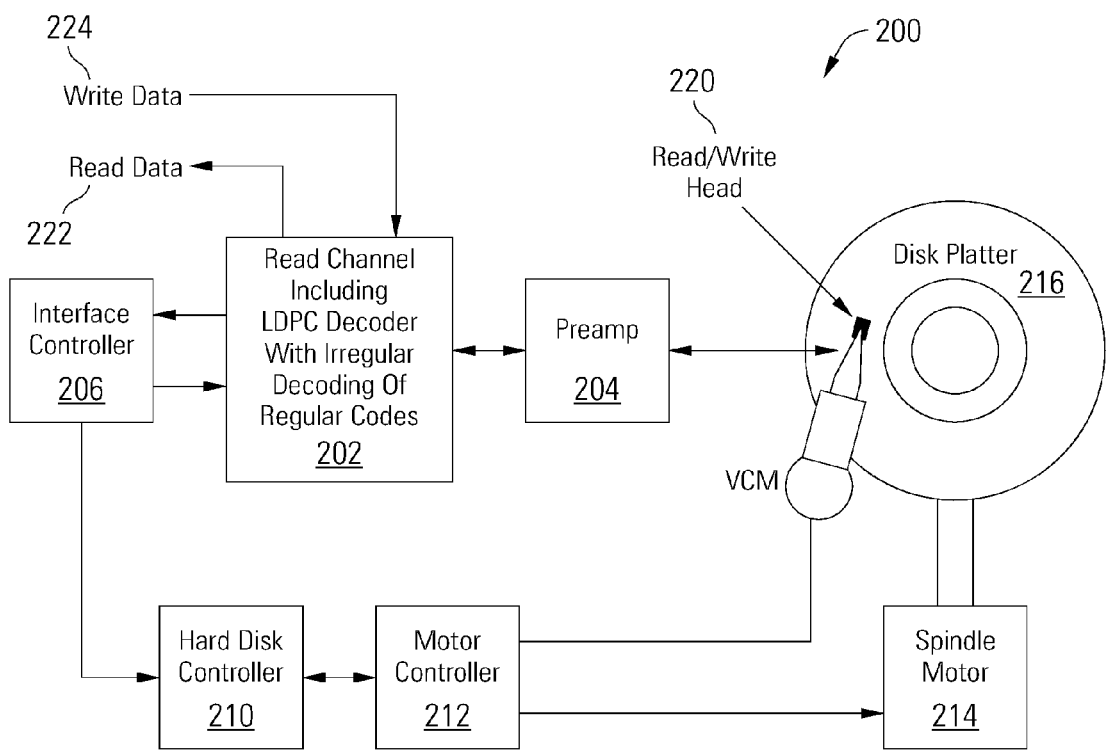
FIG. 2 depicts a storage system including a data processing circuit with an LDPC decoder implementing irregular decoding of regular codes in accordance with some embodiments of the present inventions.
Figure 3:
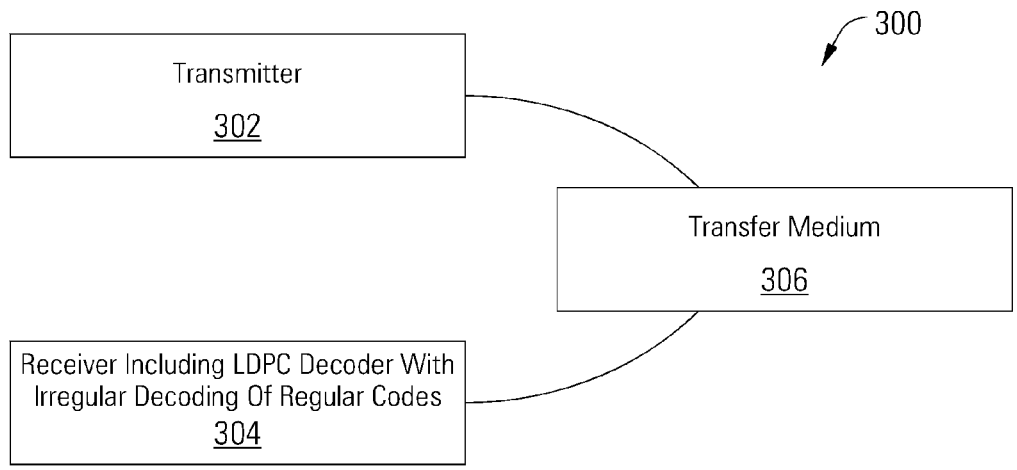
FIG. 3 depicts a wireless communication system including a data processing circuit with an LDPC decoder implementing irregular decoding of regular codes in accordance with some embodiments of the present inventions.

Although the LDPC decoder with irregular decoding of regular codes disclosed herein is not limited to any particular application, several examples of applications are presented in FIGS. 2 and 3 that benefit from embodiments of the present inventions. Turning to FIG. 2, a storage system 200 including a read channel circuit 202 having an LDPC decoder with irregular decoding of regular codes is shown in accordance with various embodiments of the present inventions. Storage system 200 may be, for example, a hard disk drive. Storage system 200 also includes a preamplifier 204, an interface controller 206, a hard disk controller 210, a motor controller 212, a spindle motor 214, a disk platter 216, and a read/write head 210. Interface controller 206 controls addressing and timing of data to/from disk platter 216. The data on disk platter 216 consists of groups of magnetic signals that may be detected by read/write head assembly 220 when the assembly is properly positioned over disk platter 216. In one embodiment, disk platter 216 includes magnetic signals recorded in accordance with either a longitudinal or a perpendicular recording scheme.

In a typical read operation, read/write head assembly 220 is accurately positioned by motor controller 212 over a desired data track on disk platter 216. Motor controller 212 both positions read/write head assembly 220 in relation to disk platter 216 and drives spindle motor 214 by moving read/write head assembly to the proper data track on disk platter 216 under the direction of hard disk controller 210. Spindle motor 214 spins disk platter 216 at a determined spin rate (RPMs). Once read/write head assembly 220 is positioned adjacent the proper data track, magnetic signals representing data on disk platter 216 are sensed by read/write head assembly 220 as disk platter 216 is rotated by spindle motor 214. The sensed magnetic signals are provided as a continuous, minute analog signal representative of the magnetic data on disk platter 216. This minute analog signal is transferred from read/write head assembly 220 to read channel circuit 202 via preamplifier 204. Preamplifier 204 is operable to amplify the minute analog signals accessed from disk platter 216. In turn, read channel circuit 202 decodes and digitizes the received analog signal to recreate the information originally written to disk platter 216. This data is provided as read data 222 to a receiving circuit. A write operation is substantially the opposite of the preceding read operation with write data 224 being provided to read channel circuit 202. This data is then encoded and written to disk platter 216.

As part of processing the received information, read channel circuit 202 applies a data detection algorithm to the received data set to yield a detected output. Soft information from the detected output may be used to calculate a quality metric. The quality metric may be an information divergence. The irregular decoding of regular LDPC codes is performed in the LDPC decoder in the read channel 202 based at least in part on the quality metric. In some cases, the read channel circuit may be implemented similar to that disclosed in relation to FIG. 4 below; and/or may operate similar to the methods disclosed below in relation to FIGS. 9a-9b, with the irregular decoding of regular codes performed similar to the methods disclosed below in relation to FIGS. 7-8.

It should be noted that storage system 200 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 200, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 200 may be modified to include solid state memory that is used to store data in addition to the storage offered by disk platter 216. This solid state memory may be used in parallel to disk platter 216 to provide additional storage. In such a case, the solid state memory receives and provides information directly to read channel circuit 202. Alternatively, the solid state memory may be used as a cache where it offers faster access time than that offered by disk platter 216. In such a case, the solid state memory may be disposed between interface controller 206 and read channel circuit 202 where it operates as a pass through to disk platter 216 when requested data is not available in the solid state memory or when the solid state memory does not have sufficient storage to hold a newly written data set. Based upon the disclosure provided herein, one of ordinary skill in the art will recognize a variety of storage systems including both disk platter 216 and a solid state memory.

Turning to FIG. 3, a data transmission system 300 including a receiver 304 having an LDPC decoder with irregular decoding of regular codes is shown in accordance with various embodiments of the present invention. Data transmission system 300 includes a transmitter 302 that is operable to transmit encoded information via a transfer medium 306 as is known in the art. The encoded data is received from transfer medium 306 by a receiver 304. Receiver 304 processes the received input to yield the originally transmitted data.

As part of processing the received information, receiver 304 applies a data detection algorithm to the received data set to yield a detected output. Soft information from the detected output may be used to calculate a quality metric. The quality metric may be an information divergence. The irregular decoding of regular LDPC codes is performed in the LDPC decoder in the read channel 202 based at least in part on the quality metric. In some cases, the read channel circuit may be implemented similar to that disclosed in relation to FIG. 4 below; and/or may operate similar to the methods disclosed below in relation to FIGS. 9a-9b, with the irregular decoding of regular codes performed similar to the methods disclosed below in relation to FIGS. 7-8.

Figure 4:
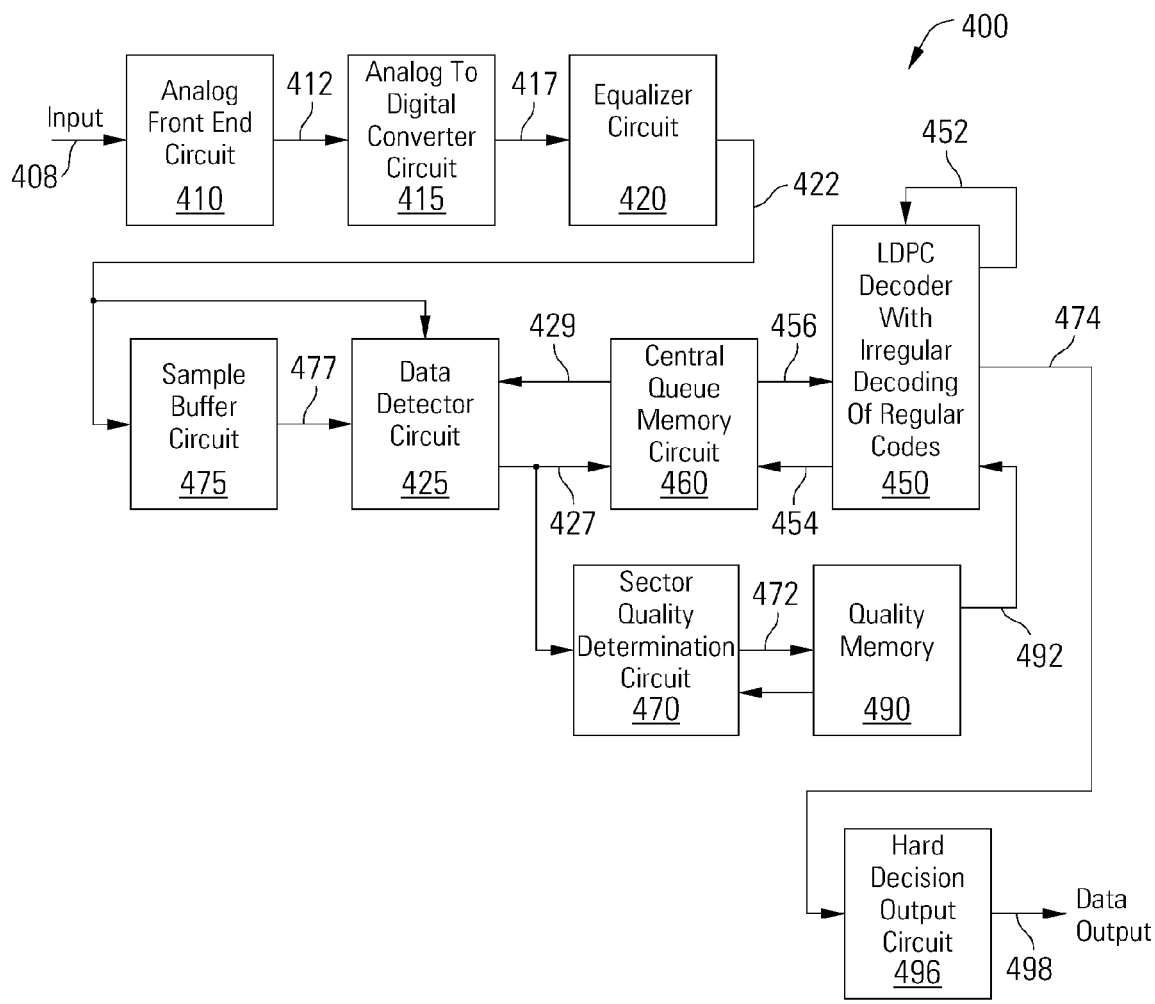
FIG. 4 depicts a data processing circuit including irregular decoding of regular codes in accordance with some embodiments of the present inventions.

FIG. 4 shows a data processing circuit 400 including quality determination circuit 470 and with LDPC decoder with irregular decoding of regular codes 450 in accordance with some embodiments of the present inventions. Data processing circuit 400 includes an analog front end circuit 410 that receives an analog signal 408. Analog front end circuit 410 processes analog signal 408 and provides a processed analog signal 412 to an analog to digital converter circuit 415. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410. In some cases, analog input signal 408 is derived from a read/write head assembly (not shown) that is disposed in relation to a storage medium (not shown). In other cases, analog input signal 408 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input signal 408 may be derived.

Analog to digital converter circuit 415 converts processed analog signal 412 into a corresponding series of digital samples 417. Analog to digital converter circuit 415 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 417 are provided to an equalizer circuit 420. Equalizer circuit 420 applies an equalization algorithm to digital samples 417 to yield an equalized output 422. In some embodiments of the present invention, equalizer circuit 420 is a digital finite impulse response filter circuit as are known in the art. It may be possible that equalized output 422 may be received directly from a storage device in, for example, a solid state storage system. In such cases, analog front end circuit 410, analog to digital converter circuit 415 and equalizer circuit 420 may be eliminated where the data is received as a digital data input. Equalized output 422 is stored to a sample buffer circuit 475 that includes sufficient memory to maintain one or more codewords until processing of that codeword is completed through a data detector circuit 425 and a data decoder circuit 450 including, where warranted, multiple "global iterations" defined as passes through both data detector circuit 425 and data decoder circuit 450 and/or "local iterations" defined as passes through data decoding circuit 450 during a given global iteration. Sample buffer circuit 475 stores the received data as buffered data 477.

Data detector circuit 425 may be any data detector circuit known in the art that is capable of producing a detected output 427. As some examples, data detector circuit 425 may be, but is not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. Detected output 425 may include both hard decisions and soft decisions (or LLR values). The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present inventions.

Detected output 427 is provided to a central queue memory circuit 460 that operates to buffer data passed between data detector circuit 425 and LDPC decoder with irregular decoding of regular codes 450. When LDPC decoder 450 is available, data decoder circuit 450 receives detected output 427 from central queue memory 460 as a decoder input 456. LDPC decoder circuit 450 applies the irregular decoding of regular codes decoding algorithm to decoder input 456 in an attempt to recover originally written data. The result of the data decoding algorithm is provided as a decoded output 454. Similar to detected output 427, decoded output 454 may include both hard decisions and soft decisions. Where the original data is recovered (i.e., the data decoding algorithm converges) or a timeout condition occurs, data decoder circuit 450 provides the result of the data decoding algorithm as a data output 474. Data output 474 is provided to a hard decision output circuit 496 where the data is reordered before providing a series of ordered data sets as a data output 498.

One or more iterations through the combination of data detector circuit 425 and LDPC decoder 450 may be made in an effort to converge on the originally written data set. As mentioned above, processing through both the data detector circuit and the LDPC decoder is referred to as a "global iteration". For the first global iteration, data detector circuit 425 applies the data detection algorithm without guidance from a decoded output. For subsequent global iterations, data detector circuit 425 applies the data detection algorithm to buffered data 477 as guided by decoded output 454. Decoded output 454 is received from central queue memory 460 as a detector input 429.

During each global iteration it is possible for LDPC decoder with irregular decoding of regular codes 450 to make one or more local iterations including application of the data decoding algorithm to decoder input 456. For the first local iteration, LDPC decoder 450 applies the data decoder algorithm without guidance from a decoded output 452. For subsequent local iterations, LDPC decoder 450 applies the data decoding algorithm to decoder input 456 as guided by a previous decoded output 452. In some embodiments of the present invention, a default of ten local iterations is allowed for each global iteration.

The freezing of poor quality symbols during early decoding stages in the LDPC decoder with irregular decoding of regular codes 450 is controlled at least in part by a quality metric calculated by sector quality determination circuit 470. A quality memory 490 is operable to store a quality metric 472 associated with each respective data set awaiting processing. Stored quality metrics 492 are provided to the LDPC decoder with irregular decoding of regular codes 450 when the corresponding LLR values 456 are decoded, enabling the LDPC decoder 450 to freeze poor quality symbols during early stage decoding iterations.

The quality metric is calculated in the sector quality determination circuit 470 using an information divergence algorithm, as information divergence has been found to be a reasonable proxy for the quality of data included in a sector. The information divergence calculation relies on the soft data (log likelihood ratio (LLR) data) from detected output 427. This soft data acts well as a random variable with a certain probability distribution. Calculating the information divergence relies on a Bregman divergence calculation in accordance with the following equation:

$$B(p \mid q) = \sum_{j=0}^{n-1} \sum_{i=0}^{M} [\text{LLR\_p}(i) - \text{LLR\_q}(i)],$$

where p and q are two probability mass functions, and M is the number of LLR values for each symbol. For example, in a two bit symbol system, M is equal to three (i.e., LLR[0], LLR[1], LLR[2], LLR[3]). A logarithm taken on the coefficients and normalized to (i.e., subtracted by) the log(p(i)(log(q(j))) and p_k(j)(q_k(j)) is the largest coefficient in p_k (q_k). The resulting vectors p' and q' are defined in the equations below:

p'=[LLR_p(0), LLR_p(1), . . . LLR_p(n)]; and q'=[LLR_q(0), LLR_q(1), . . . LLR_q(n)], where n is the number of soft data elements in a sector of data received as detected output 427. These two vectors, p and q, are used in the Bregman divergence calculation set forth above. The vector p is the actual soft data received as part of detected output 427, and the vector q is an ideal distribution.

As an example using a GF(4) data processing system (i.e., a two bit non-binary processing system) where an output in detected output 427 may be 0, 1, 2 or 4 with four corresponding soft data values LLR0, LLR1, LLR2, LLR3, respectively.

In this case, let the true value (i.e., ideal distribution) be x0 with an LLR value of [0, −30, −30, −30], and let the corresponding hard decision be x1 with an LLR value of [0, −30, −30, −30]. Ideally, one would want to calculate the information divergence between x and x0 to get a perfect measurement of the difference of the probability mass functions between x and x0. More practically, embodiments of the present invention calculate divergence between x and x1. From a practical standpoint, the divergence between x and x1 is almost equal to the divergence between x and x0 where the hard decision error count is low and the hard decision is incorrect. The result of the Bregman divergence calculation is summed over a number of instances and the result is provided as quality metric 472 where it is stored in relation to the sector from which it was calculated.

The following pseudocode shows an example operation of providing quality metric 472 by sector quality determination circuit 470:

```
quality metric 472 = 0 // Initialize the quality metric //
For (i=0 to (n−1)){
    //M is the # of LLR values for each hard decision value,
    e.g., 4 for a 2 bit non-binary //
    LLR_x = Array of detected output 327(i*M to i*(2M−1));
    // identify the hard decision value that corresponds to the highest
    value of LLR_x //
    HD_x = index of LLR_x with the greatest LLR value;
    //Set all LLRs to least likely values //
    LLR_x1=[−31, −31, −31, −31];
    //Set LLR value corresponding to the HD_x to a more likely value //
    LLR_x1 (HD_x) = 0;
    //Calculate quality metric 472//
    quality metric 472 = quality metric 472 + Information Divergence
    Value;
}
```

In this case, the information divergence value is calculated in accordance with the Bregman divergence calculation discussed above.

In operation, the LDPC decoder with irregular decoding of regular codes 450 freezes symbols with the lowest values of quality metric 472 during early decoding iterations. Based upon the disclosure provided herein, one of ordinary skill in the art may recognize other quality metrics that may be used in relation to different embodiments of the present inventions.

Figure 5:
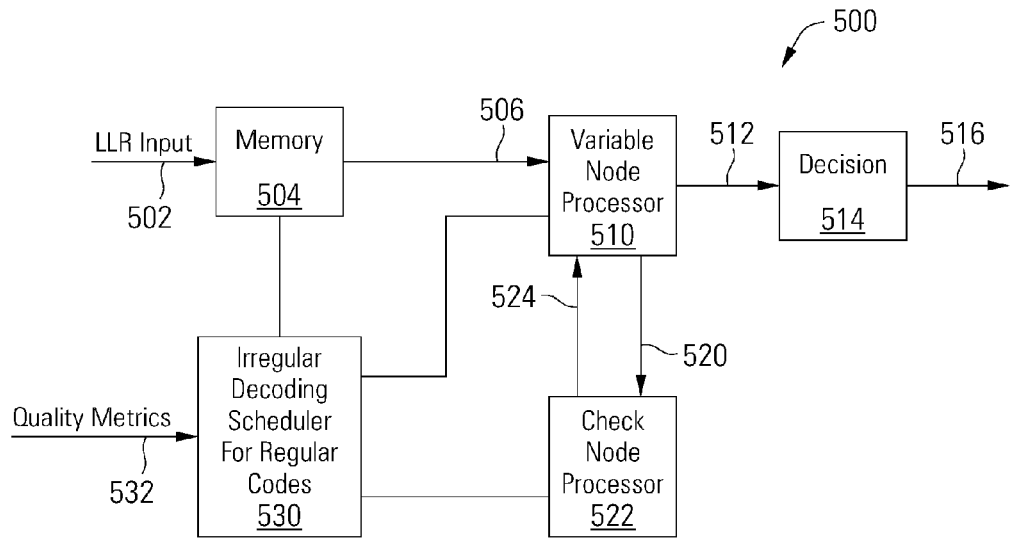
FIG. 5 depicts a block diagram of an LDPC decoder with irregular decoding of regular codes in accordance with some embodiments of the present inventions.

Turning to FIG. 5, a block diagram of an LDPC decoder with irregular decoding of regular codes 500 is depicted in accordance with some embodiments of the present inventions. The LDPC decoder with irregular decoding of regular codes 500 may be a binary or multi-level decoder, layered or non-layered, and is not limited to any particular algorithm for parity check calculations or message generation techniques. Input data 502 is stored in a memory 504. Input data 502 includes LLR values in some embodiments. LLR values 506 from memory 504 are provided to a variable node processor 510, which generates V2C messages 520 containing LLR values for the perceived value of each bit or symbol. A check node processor 522 receives the V2C messages 520 and performs parity check calculations for each check node based on messages from connected variable nodes. The check node processor 522 also generates C2V messages 524, enabling the variable node processor 510 to update the perceived value for each variable node based on C2V messages 524 from connected check nodes. Updated variable node values may also be updated in the memory 504 during local decoding iterations, either by the variable node processor 510 or check node processor 522 or both. LLR values 512 from the variable node processor 510 may also be provided to a decision circuit 514 which generates a hard decision output 516.

An irregular decoding scheduler for regular codes 530 in the LDPC decoder 500 receives quality metrics 532 representing an indication of the quality of the LLR values of the symbols at input 502. The scheduler 530 causes the variable node processor 510 to calculate V2C messages 520 for all symbols during the first decoding iteration. The scheduler 530 also sorts the symbols by the quality metrics 532, dividing the symbols into multiple groups. Symbols in a poor quality group are then frozen by the scheduler 530 during early decoding iterations, so that V2C messages 520 for good quality symbols are updated at each iteration, while the V2C messages 520 for the poor quality symbols are frozen at the initially calculated values. The variable node processor 510 thus repeatedly transmits the same V2C messages 520 for the poor quality symbols during successive iterations, allowing the decoding process to focus on updating the good quality symbols. The scheduler 530 unfreezes the symbols in the poor quality group, for example after half the available decoding iterations, allowing the V2C messages 520 to be updated for all symbols during the later decoding iterations.

Figure 6:
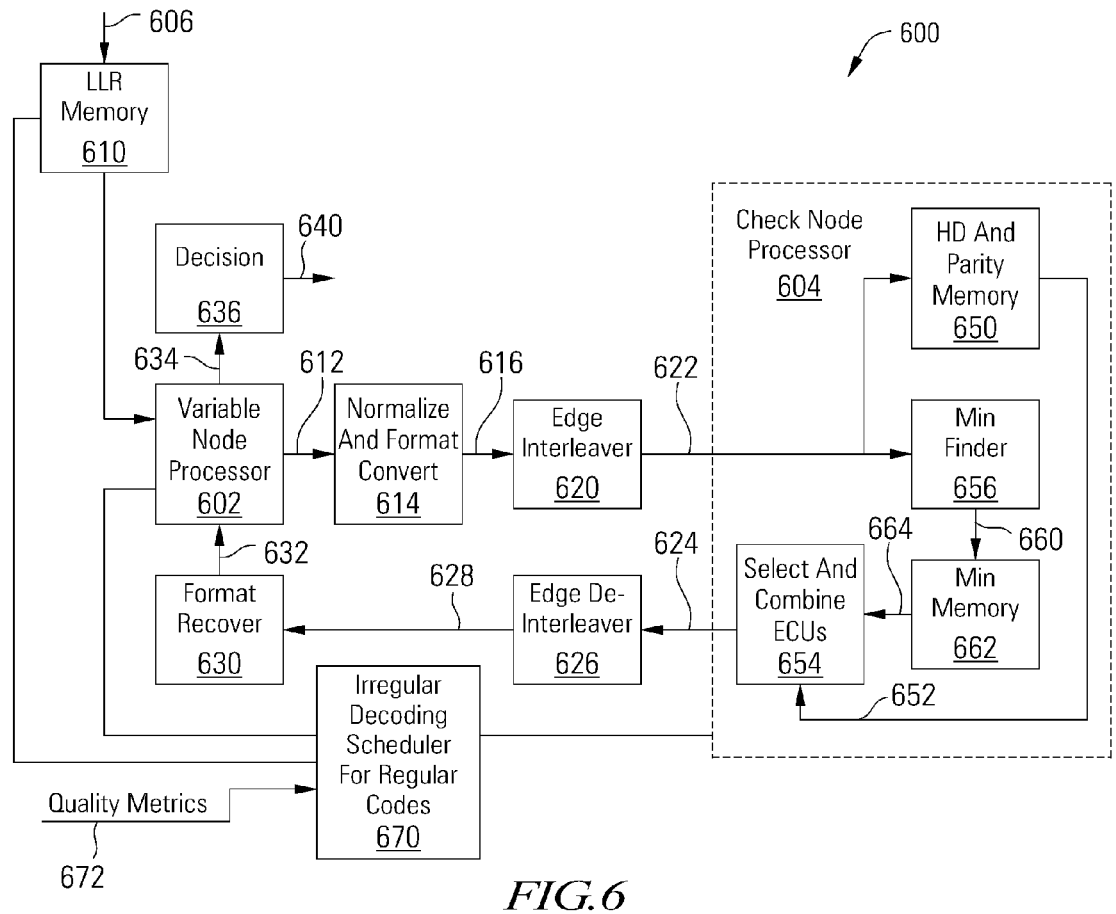
FIG. 6 depicts a block diagram of a multi-level min-sum based LDPC decoder with irregular decoding of regular codes in accordance with some embodiments of the present inventions.

Turning to FIG. 6, in some embodiments, the LDPC decoder with irregular decoding of regular codes is a min-sum based LDPC decoder 600 in which check nodes calculate a minimum, next minimum and hard decision value based on incoming V2C or variable node message vectors. However, it is important to note that the LDPC decoder with irregular decoding of regular codes is not limited to the min-sum based non-binary LDPC decoder 600 of FIG. 6, but that any suitable LDPC decoder may be operable to implement the irregular decoding of regular codes disclosed herein.

The min-sum based non-binary LDPC decoder 600 is provided with an input 606, for example containing a hard decision and corresponding LLR values, which are stored in a symbol memory 610. The input 606 is provided to the variable node processor 602 from the symbol memory 610, and the variable node processor 602 updates the perceived value of each symbol based on the value from input 606 and on C2V message vectors or check node messages from a check node processor 604. The variable node processor 602 also generates V2C message vectors 612 or variable node messages for neighboring check nodes.

Check nodes (implemented in check node processor 604) in a min-sum based non-binary LDPC decoder receive incoming messages from connected or neighboring variable nodes (implemented in variable node processor 602) and generate outgoing messages to each neighboring variable node to implement the parity check matrix for the LDPC code, an example of which is graphically illustrated in the Tanner graph of FIG. 1. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message with for each neighboring variable node.

In various embodiments of LDPC decoders that may be adapted to generate and use a fractional unsatisfied check quality metric, the variable node processor 602 and check node processor 604 may each be unitary, discrete components, or their functions may be distributed and intermixed in multiple components. The terms variable node processor and check node processor are therefore not limited to two discrete processing components, but apply generally to any components or combinations of components in an LDPC decoder that update variable node values and generate variable node to check node messages for variable node processing, and that perform check node constraint calculations and generate check node to variable node messages for check node processing.

Both V2C and C2V messages in this embodiment are vectors, each including a number of sub-messages with LLR values. Each V2C message vector from a particular variable node contains sub-messages corresponding to each symbol in the Galois Field, with each sub-message giving the likelihood that the variable node contains that particular symbol. For example, given a Galois Field GF(q) with q elements, V2C and C2V messages will include at least q sub-messages representing the likelihood for each symbol in the field.

Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node.

In the min-sum based decoding disclosed herein, the check nodes calculate the minimum sub-message $min_1(d)$, the index idx(d) of $min_1(d)$, and the sub-minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $min_1(d)$, idx(d) and $min_2(d)$ is calculated based on the gathered sub-messages for that symbol d. For a Galois Field with q symbols, the check node will calculate the $min_1(d)$, idx(d) and $min_2(d)$ sub-message for each of the q−1 non-zero symbols in the field except the most likely symbol.

The V2C message vectors 612 from the variable node processor 602 are provided to a message format converter 614 which converts the format of V2C message vectors 612 to a format consisting of two parts, the most likely symbol, and the LLR of other symbols, normalized to the most likely symbol, yielding normalized V2C message vectors 616 in the second format. Message normalization in the message format converter 614 is performed with respect to the most likely symbol. Thus, the V2C and C2V vector format includes two parts, an identification of the most likely symbol and the LLR for the other q−1 symbols, since the most likely symbol has LLR equal to 0 after normalization. The normalized V2C message vectors 616 are provided to an edge interleaver 620 which shuffles messages on the boundaries at message edges, randomizing noise and breaking dependencies between messages. The interleaved normalized V2C message vectors 622 are provided to the check node processor 604, which generates C2V messages 624 for each neighboring variable node processor based on extrinsic V2C messages from other neighboring variable node processors.

The C2V messages 624 are provided to an edge de-interleaver 626, which reverses the process of the edge interleaver 620, and then to a format recovery circuit 630, which converts message vectors from the second, normalized format to the first message vector format of the variable node processor 602, reversing the process of the message format converter 614. The resulting first format C2V messages 632 are provided to the variable node processor 602 for use in updating perceived LLR values in variable nodes. In other embodiments, the variable node processor 602 is adapted to operate directly with message vectors of the second, normalized format. In these embodiments, the message format converter 614 and format recovery circuit 630 are omitted.

When the values in the min-sum based non-binary LDPC decoder 600 converge and stabilize, or when a limit is reached on the number of local iterations, the variable node processor 602 provides the total LLR $S_n(a)$ 634 to a decision circuit 636 to generate a hard decision 640 based on the $argmin_a$ of the total LLR $S_n(a)$.

The check node processor 604 includes a hard decision and parity memory circuit 650 that processes the interleaved normalized V2C message vectors 622 to provide the most likely symbol 652 to a select and combine circuit 654 having a number of elementary computation units (ECUs). The check node processor 604 also includes a min finder 656 that calculates the $min_1(d)$, idx(d) and $min_2(d)$ sub-messages 660 for each of the q symbols in the Galois Field and stores them in a min memory 662. The stored $min_1(d)$, idx(d) and $min_2(d)$ sub-messages 664 are provided by min memory 662 to the select and combine circuit 654. The select and combine circuit 654 combines the $min_1(d)$, idx(d) and $min_2(d)$ sub-messages 664 and the most likely symbol 652 to generate the C2V messages 624.

The message vector format conversion performed by message format converter 614 on V2C message vectors 612 is reversed by format recovery circuit 630, providing C2V messages 632 to variable node processor 602 in the format used by the variable node processor 602.

An irregular decoding scheduler for regular codes 670 in the LDPC decoder 600 receives quality metrics 672 representing an indication of the quality of the LLR values of the symbols at input 606. The scheduler 670 causes the variable node processor 602 to calculate V2C messages 612 for all symbols during the first decoding iteration. The scheduler 670 also sorts the symbols by the quality metrics 672, dividing the symbols into multiple groups. Symbols in a poor quality group are then frozen by the scheduler 670 during early decoding iterations, so that V2C messages 612 for good quality symbols are updated at each iteration, while the V2C messages 612 for the poor quality symbols are frozen at the initially calculated values. The variable node processor 602 thus repeatedly transmits the same V2C messages 612 for the poor quality symbols during successive iterations, allowing the decoding process to focus on updating the good quality symbols. The scheduler 670 unfreezes the symbols in the poor quality group, for example after half the available decoding iterations, allowing the V2C messages 612 to be updated for all symbols during the later decoding iterations.

Figure 7:
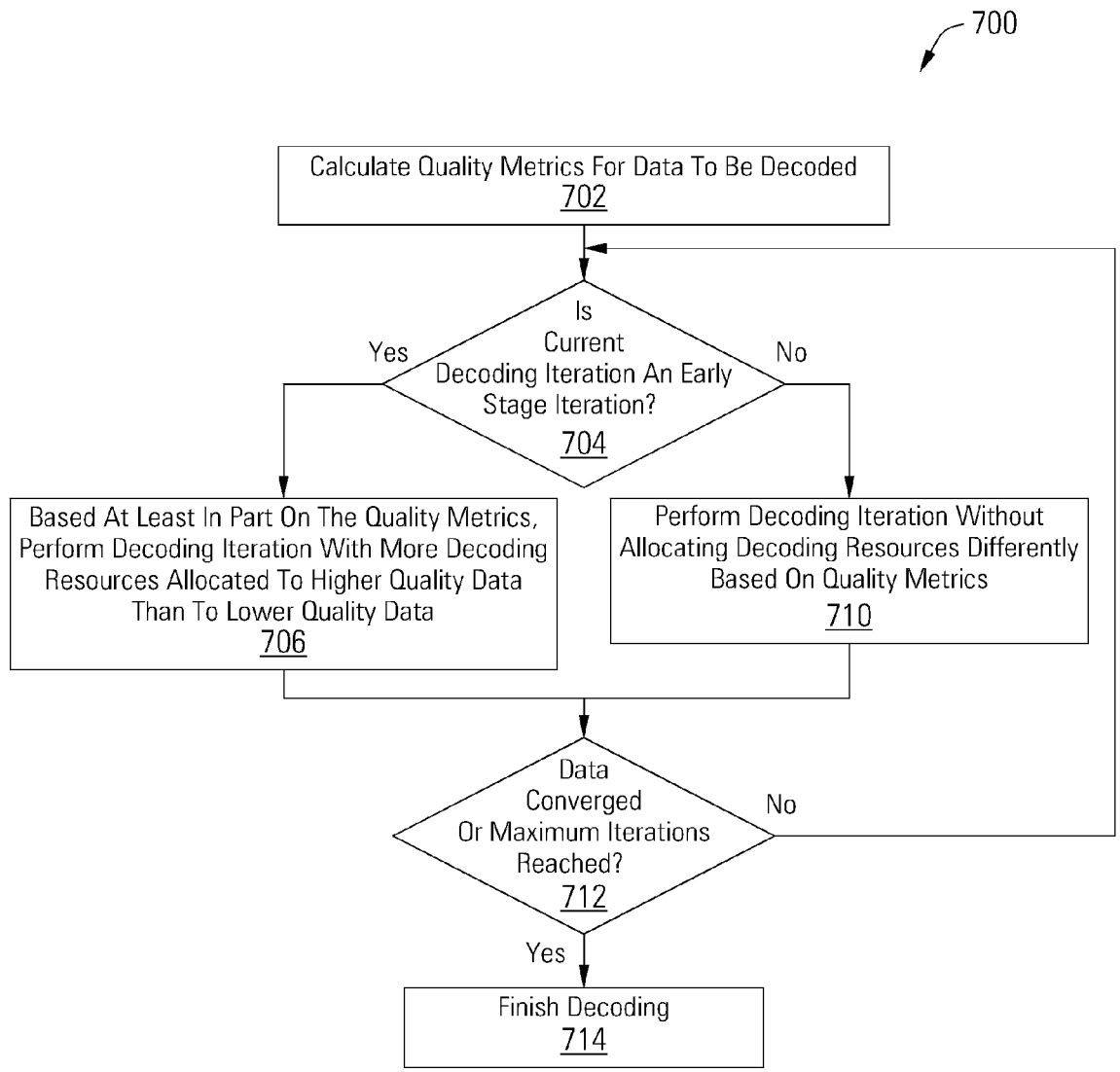
FIG. 7 is a flow diagram showing a method for irregular decoding of regular codes in an LDPC decoder in accordance with some embodiments of the present inventions.

Turning to FIG. 7, a flow diagram 700 is depicted of an operation for irregular decoding of regular codes in an LDPC decoder in accordance with various embodiments of the present inventions. Following flow diagram 700, quality metrics are calculated for data to be decoded. (Block 702) In some embodiments, the data to be decoded is in the form of LLR values, and the quality metrics are calculated using an information divergence algorithm. A determination is made as to whether the current decoding iteration is an early stage iteration. (Block 704) If so, based at least in part on the quality metrics, the decoding iteration is performed with more decoding resources allocated to higher quality data than to lower quality data. (Block 706) In some embodiments, this is achieved by reusing initially calculated V2C messages for the lower quality data along with newly calculated V2C messages for higher quality data for the first half of the decoding iterations. If the decoding iteration is not in an early stage iteration (block 704), the decoding iteration is performed without allocating decoding resources differently based on quality metrics. (Block 710) A determination is made as to whether the data has converged or the maximum number of decoding iterations has been reached. (Block 712) If so, decoding is finished. Otherwise, decoding continues at block 704.

Figure 8:
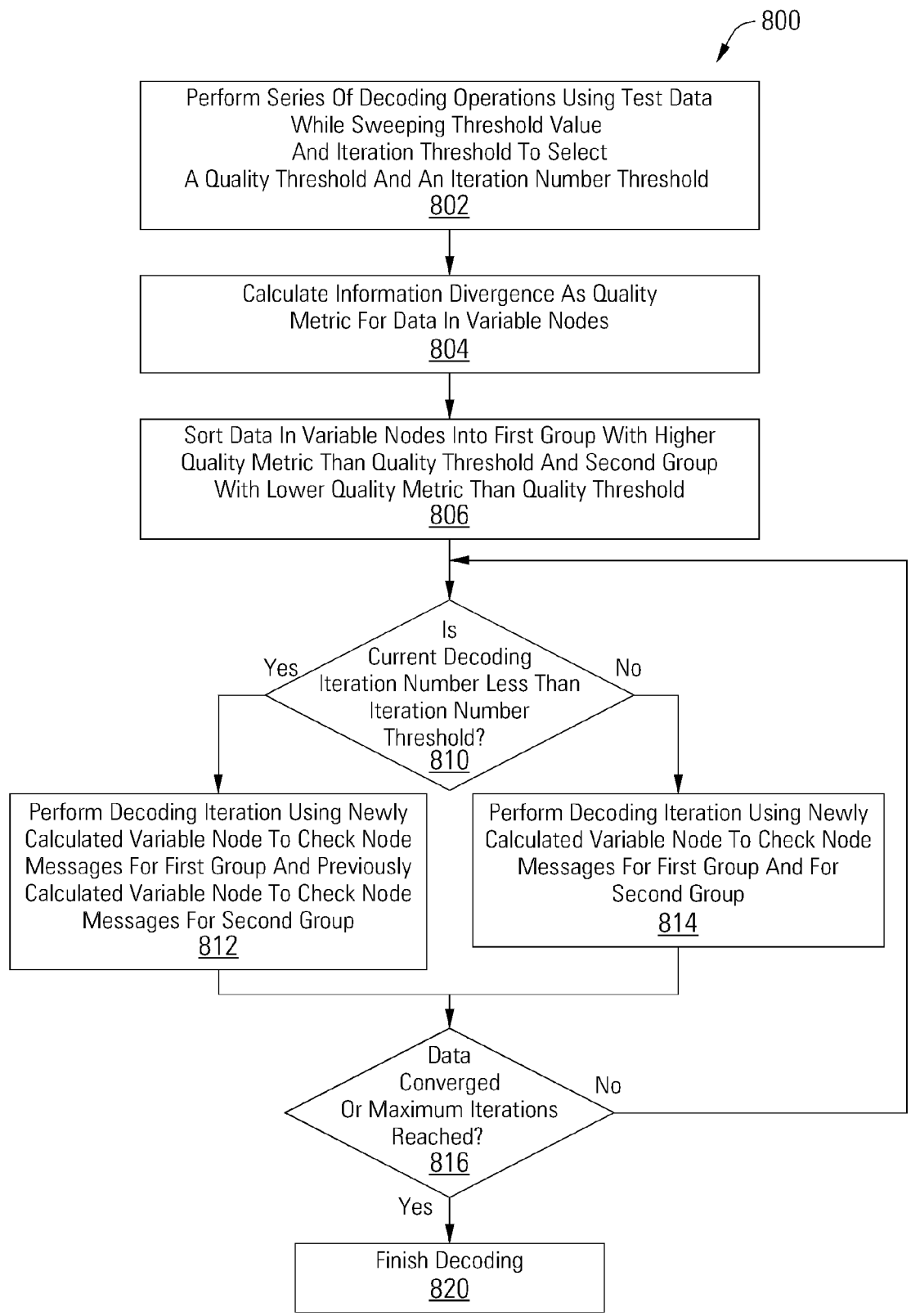
FIG. 8 is a flow diagram showing a method for calibrating an LDPC decoder scheduler and for irregular decoding of regular codes in an LDPC decoder in accordance with some embodiments of the present inventions.

Turning to FIG. 8, a flow diagram 800 is depicted of an operation for calibrating an LDPC decoder scheduler and for irregular decoding of regular codes in an LDPC decoder in accordance with some embodiments of the present inventions. Following flow diagram 800, a series of decoding operations is performed using test data while sweeping threshold value between higher quality data and lower quality data and iteration threshold to select a quality threshold and an iteration number threshold. (Block 802) The test data may be prepared data designed to correspond with expected channel conditions, or may be actual channel data. In some embodiments, the quality threshold divides symbols in variable nodes into those with higher information divergence than a threshold value and those with lower information divergence than the threshold value. The information divergence is calculated as a quality metric for symbols in variable nodes. (Block 804) The symbols in variable nodes are sorted into a first group with higher quality metrics than the quality threshold and a second group with lower quality metrics than the quality threshold. (Block 806) A determination is made as to whether the current decoding iteration number is less than an iteration number threshold. (Block 810) If so the decoding iteration is performed using newly calculated variable node to check node messages for the first group and previously calculated variable node to check node messages for the second group. (Block 812) Otherwise, if the current decoding iteration number is greater than the iteration number threshold, the decoding iteration is performed using newly calculated variable node to check node messages for both the first group and the second group. (Block 814) A determination is made as to whether the data converged or whether the maximum number of iterations has been reached. (Block 816) If so, decoding is finished. (Block 820) Otherwise, decoding continues at block 810.

Figure 9A:
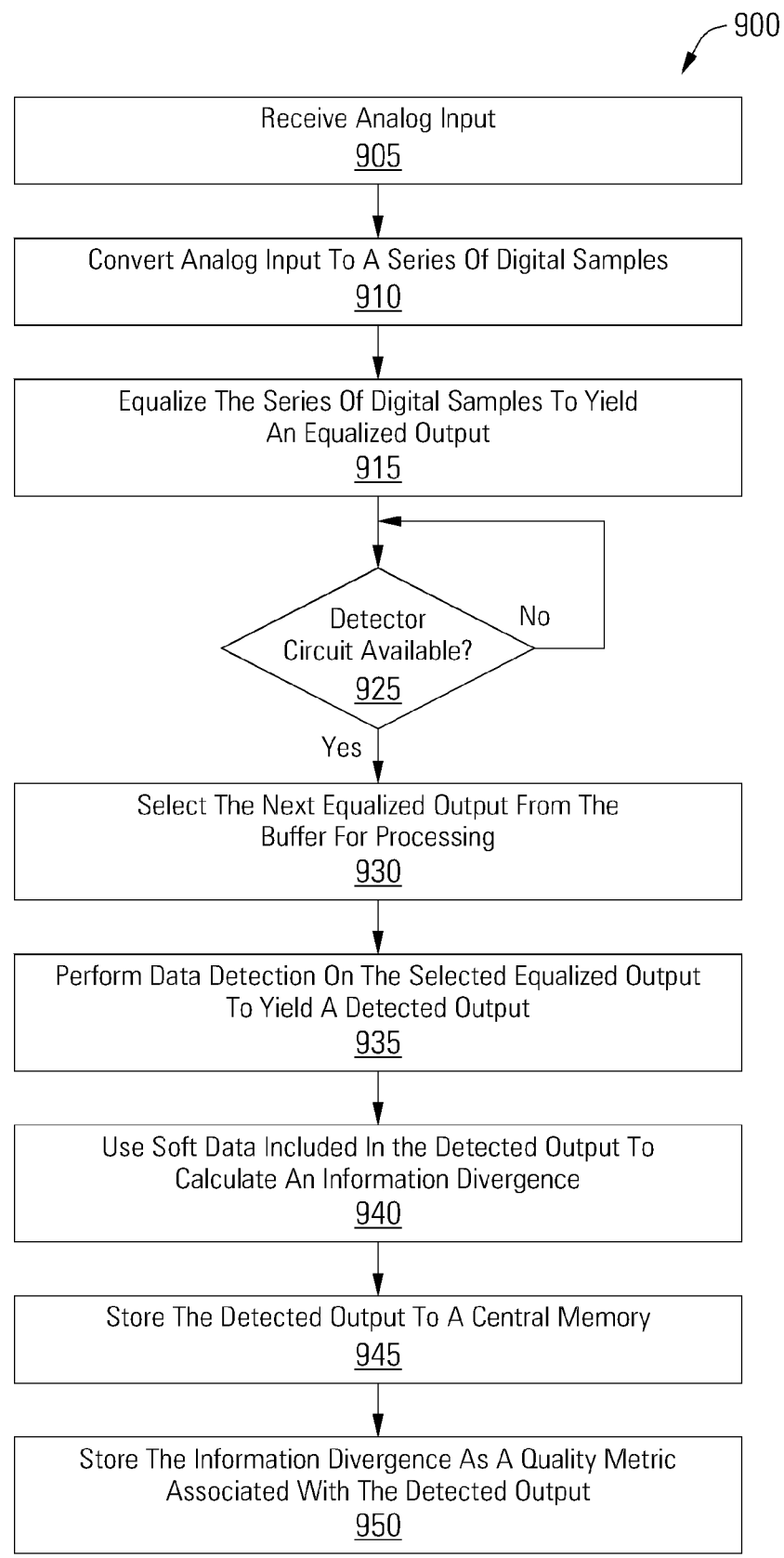
FIGS. 9a-9b are flow diagrams showing a method for data processing including irregular decoding of regular codes in accordance with some embodiments of the present inventions.
Figure 9B:
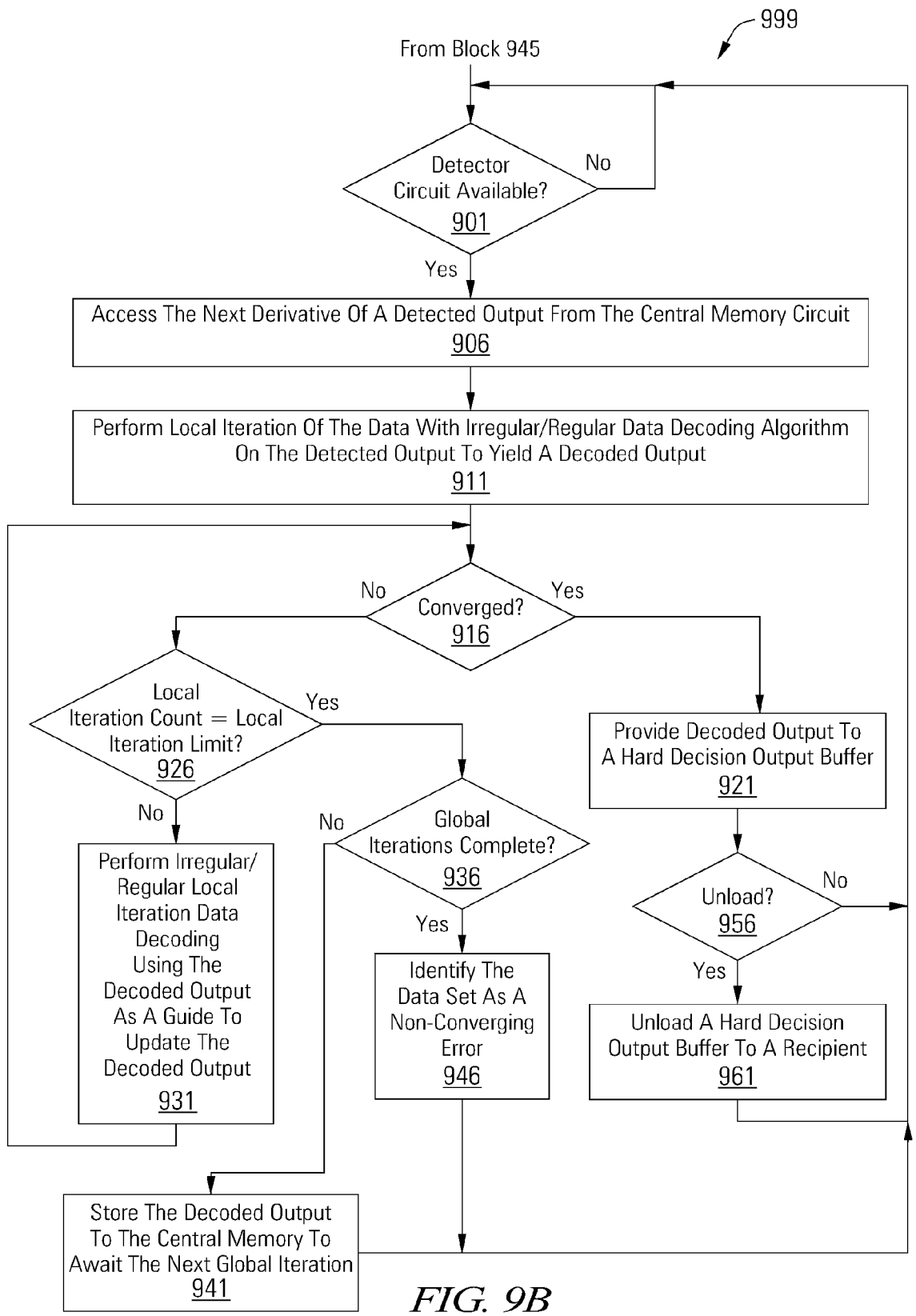

Turning to FIGS. 9a-9b, a method for data processing including irregular decoding of regular codes is disclosed in accordance with some embodiments of the present inventions. Following flow diagram 900 of FIG. 9a, an analog input is received (block 905). The analog input may be derived from, for example, a storage medium or a data transmission channel. Based upon the disclosure provided herein, one of ordinary skill in the art will recognize a variety of sources of the analog input. The analog input is converted to a series of digital samples (block 910). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 915). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 920).

It is determined whether a data detector circuit is available to process a data set (block 925). Where a data detector circuit is available to process a data set (block 925), the next equalized output from the buffer is accessed for processing (block 930). The data detector circuit may be, for example, a Viterbi algorithm data detector circuit or a maximum a posteriori data detector circuit. The next equalized output is selected for processing by the available data detector circuit (block 930). A data detection algorithm is applied to the accessed equalized output by the data detector circuit to yield a detected output (block 935).

Soft data included in the detected output is used to calculate an information divergence value (block 940). This information divergence value is calculated in accordance with the following pseudocode:

```
Information Divergence Value = 0 // Initialize the information divergence value //
For (i=0 to (n−1)){
    //M is the # of LLR values for each hard decision value,
    e.g., 4 for a 2 bit non-binary //
    LLR_x = Array of the detected output(i*M to i*(2M−1));
    // identify the hard decision value that corresponds to the highest
    value of LLR_x //
    HD_x = index of LLR_x with the greatest LLR value;
    //Set all LLRs to least likely values //
    LLR_x1=[−31, −31, −31, −31];
    //Set LLR value corresponding to the HD_x to a more likely value //
    LLR_x1 (HD_x) = 0;
    //Calculate Information Divergence Value //
    Information Divergence Value = Information Divergence Value +
    Update Value;
}
```

In this case, the update value is calculated in accordance with the Bregman divergence calculation disclosed above.

The detected output is stored to a central queue memory circuit where it awaits processing by a data decoder circuit (block 945). In addition, the information divergence value calculated in block 940 is stored as a quality metric for the equalized output recently processed through the data detected output (block 950).

Turning to FIG. 9b and following flow diagram 999, it is determined whether a data decoder circuit is available (block 901) in parallel to the previously described data detection process of FIG. 9a. The data decoder circuit may be, for example, an LDPC decoder with irregular decoding of regular codes. Where the LDPC decoder is available (block 901) the next derivative of a detected output is selected from the central queue memory circuit (block 906). The derivative of the detected output may be, for example, an interleaved (shuffled) version of a detected output from the data detector circuit. A first iteration of a data decoding algorithm is applied by the data decoder circuit to the selected detected output to yield a decoded output (block 911). In this first iteration, V2C messages are calculated for all symbols in variable nodes, regardless of quality. It is then determined whether the decoded output converged (e.g., resulted in the originally written data as indicated by the lack of remaining unsatisfied checks) (block 916).

Where the decoded output converged (block 916), it is provided as a decoded output codeword to a hard decision output buffer (e.g., a re-ordering buffer) (block 921). It is determined whether the received output codeword is ready to be unloaded from the hard decision output buffer (block 956). When the currently received output codeword is ready to be unloaded, for example when it is sequential to a previously reported codeword, it is provided to a recipient as an output (block 961).

Alternatively, where the decoded output failed to converge (e.g., errors remain) (block 916), it is determined whether the number of local iterations already applied equals the maximum number of local iterations (block 926). Where another local iteration is allowed (block 926), the data decoding algorithm is applied to the selected data set using the decoded output as a guide to update the decoded output (block 931). The processes of blocks starting at block 916 are repeated for the next local iteration. As disclosed above, during the local iterations using the algorithm for irregular decoding of regular codes (block 911), the lower quality symbols are frozen during early decoding iterations, allowing the higher quality symbols to converge more quickly, and are updated normally during later decoding iterations.

Where all of the local iterations have occurred (block 926), it is determined whether all of the global iterations have been applied to the currently processing data set (block 936). Where the number of global iterations has not completed (block 936), the decoded output is stored to the central queue memory circuit to await the next global iteration (block 941). Alternatively, where the number of global iterations has completed (block 936), an error is indicated and the data set is identified as non-converging (block 946).

The LDPC decoder with irregular decoding of regular codes disclosed herein provides some of the benefits of an irregular LDPC code with the simplicity of a decoder for a regular LDPC code. As a result, the LDPC decoder may either be a smaller size with lower power consumption without reducing performance, or may maintain the same size and power consumption but with better error correction performance than traditional regular code LDPC decoders.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for an LDPC decoding with irregular decoding of regular codes. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
a low density parity check decoder operable to iteratively generate and process check node to variable node messages and variable node to check node messages between a plurality of check nodes and variable nodes, and to initially allocate more processing resources to variable node values identified as good quality than to variable node values identified as poor quality, wherein the low density parity check decoder is operable to process a regular low density parity check code.

2. The apparatus of claim 1, further comprising a quality determination circuit operable to calculate a quality metric for data symbols at an input to the low density parity check decoder.

3. The apparatus of claim 2, further comprising a data detector operable to yield log likelihood ratio values for the data symbols, wherein the quality determination circuit is operable to calculate the quality metric for the data symbols based on the log likelihood ratio values.

4. The apparatus of claim 2, wherein the quality determination circuit is operable to calculate an information divergence for the data symbols.

5. The apparatus of claim 1, further comprising a comparison circuit operable to compare a quality metric for each data symbol at an input to the low density parity check decoder with a quality threshold to identify the variable node values for the data symbols as good quality or as poor quality.

6. The apparatus of claim 5, wherein the comparison circuit comprises a scheduler in the low density parity check decoder.

7. The apparatus of claim 1, wherein the low density parity check decoder is operable to freeze the variable node values identified as poor quality during a first portion of a plurality of decoding iterations as the variable node values identified as good quality are updated, and to update the variable node values identified as poor quality and the variable node values identified as good quality during a second portion of the plurality of decoding iterations, where the second portion is decoded after the first portion.

8. The apparatus of claim 1, wherein the low density parity check decoder is operable to freeze the variable node to check node messages associated with the variable node values identified as poor quality during a first portion of a plurality of decoding iterations, and to update the variable node to check node messages associated with the variable node values identified as poor quality and the variable node values identified as good quality during a second portion of the plurality of decoding iterations, where the second portion is decoded after the first portion.

9. The apparatus of claim 8, wherein freezing the variable node to check node messages comprises passing old variable node to check node messages calculated during a previous decoding iteration.

10. The apparatus of claim 1, wherein the low density parity check decoder is operable to allocate more processing resources to the variable node values identified as good quality during a first half of a maximum number of decoding iterations than to variable node values identified as poor quality.

11. The apparatus of claim 1, wherein the apparatus is implemented as an integrated circuit.

12. The apparatus of claim 1, wherein the apparatus is incorporated in a storage device.

13. The apparatus of claim 12, wherein the storage device comprises a redundant array of independent disks.

14. The apparatus of claim 1, wherein the apparatus is incorporated in a transmission system.

15. A method for decoding data in a regular code low density parity check decoder, comprising:
determining a quality metric of each of a plurality of data symbols based on a log likelihood ratio value for each of the plurality of data symbols;

sorting the plurality of data symbols by the quality metrics into at least a first group and a second group, wherein the first group has better quality metrics than the second group; and performing a plurality of decoding iterations on the plurality of data symbols, wherein the data symbols in the second group are frozen during an earlier portion of the plurality of decoding iterations and are not frozen during a later portion of the plurality of decoding iterations.

16. The method of claim 15, wherein determining the quality metric of each of the plurality of data symbols comprises calculating an information divergence of each of the plurality of data symbols.

17. The method of claim 15, wherein freezing the data symbols in the second group comprises reusing previously calculated variable node to check node messages in the regular code low density parity check decoder for the data symbols in the second group.

18. The method of claim 15, wherein sorting the plurality of data symbols by the quality metrics comprises comparing the quality metric of each of the plurality of data symbols with a quality threshold dividing the first group and the second group.

19. The method of claim 18, further comprising performing a plurality of decoding operations with test data while sweeping the quality threshold to select a value for the quality threshold.

20. A storage system comprising:

a storage medium maintaining a data set;

a read/write head assembly operable to sense the data set on the storage medium; and a data processing circuit operable to correct errors in the data set, wherein the data processing circuit comprises a low density parity check decoder operable to iteratively generate and process check node to variable node messages and variable node to check node messages between a plurality of check nodes and variable nodes, and to initially allocate more processing resources to variable node values identified as good quality than to variable node values identified as poor quality, wherein the low density parity check decoder is operable to process a regular low density parity check code.

* * * * *